United States Patent [19]

Jericho et al.

[11] 4,078,897
[45] Mar. 14, 1978

[54] APPARATUS FOR PRODUCING MONOCRYSTALS

[75] Inventors: Karl Jericho, Hanau; Joachim Floymayr, Hanau am Main; Uwe Reimpell; Dieter Drechsel, both of Bruchkobel, all of Germany

[73] Assignee: Leybold-Heraeus GmbH & Co. KG, Cologne, Germany

[21] Appl. No.: 676,187

[22] Filed: Apr. 12, 1976

[30] Foreign Application Priority Data

Apr. 11, 1975 Germany .............................. 2515805

[51] Int. Cl.$^2$ ............................................ B01J 17/10
[52] U.S. Cl. .............................. 23/273 R; 23/273 SP; 156/620; 269/275; 269/22; 156/DIG. 98
[58] Field of Search ................ 23/273 Z; 156/617 SP, 156/617 M, 620 NS, 620; 269/22, 275, 287

[56] References Cited

U.S. PATENT DOCUMENTS

| | | | |
|---|---|---|---|
| 2,826,420 | 3/1958 | Klingler | 269/22 |
| 2,876,147 | 3/1959 | Kniepkamp | 23/273 Z |
| 3,159,408 | 12/1964 | Sanchez | 156/620 |
| 3,189,415 | 6/1955 | Emeis | 23/273 Z |
| 3,222,747 | 12/1965 | Meadows | 269/22 |
| 3,259,468 | 7/1966 | Stevens | 23/273 Z |
| 3,428,436 | 2/1969 | Tucker | 23/273 Z |
| 3,522,014 | 7/1970 | Keller | 23/273 Z |
| 3,668,359 | 6/1972 | Emmerson | 269/275 |
| 3,972,684 | 8/1976 | Defosse | 23/273 SP |

FOREIGN PATENT DOCUMENTS

| | | | |
|---|---|---|---|
| 79-004 | 7/1969 | Germany | 23/273 Z |
| 1,519,901 | 2/1970 | Germany | 156/620 |
| 640,666 | 1962 | Italy | 23/273 Z |
| 39-2753 | 3/1964 | Japan | 156/617 SP |
| 412,816 | 11/1966 | Switzerland | 156/617 SP |

*Primary Examiner*—Stephen J. Emery
*Attorney, Agent, or Firm*—Burgess, Dinklage & Sprung

[57] ABSTRACT

Apparatus for producing monocrystals by potless zone melting, in which the monocrystal, setting out from a seed crystal, passes through a neck and a transitional zone into the main part of the monocrystal. A chamber is provided for the formation of a vacuum or a protective gas atmosphere plus a heating device for the production of the melting heat, driving means for the mechanical movements necessary for the crystal formation, a mounting for the seed crystal, and a supporting device which is applicable to the monocrystal beyond the neck, and a plurality of gripping bodies distributed about the circumference and applicable to the monocrystal radially on its substantially cylindrical surface the gripping bodies are disposed such that they first perform a radial approach to the monocrystal until a virtually force-free contact is made therewith, adapting themselves to the surface geometry and position of the monocrystal, whereupon the gripping force is increased and the gripping bodies are locked.

8 Claims, 5 Drawing Figures

APPARATUS FOR PRODUCING MONOCRYSTALS

BACKGROUND

The invention relates to an apparatus for the production of monocrystals by a potless zone melting process in which the monocrystal has a shape which, starting out from a seed crystal, passes through a constricted portion or "neck" and a transitional zone and on into the essentially cylindrical main body of the crystal, the said apparatus consisting of a chamber for the formation of a vacuum or of a shielding gas atmosphere, a heating apparatus for the production of the melting heat, driving means for the mechanical movements necessary for the formation of the crystal, a mounting for the seed crystal, and a supporting device which can be applied to the monocrystal at a point beyond the neck and consists of a plurality of gripping bodies adapted for radial engagement with the substantially cylindrical surface of the monocrystal and distributed about its circumference.

In the production of monocrystals by the potless zone melting process, the extremities of the rod from which the monocrystal is formed are generally rotated. This is accomplished by a corresponding revolving of the crystal and rod clamping means. In case a change is produced in the cross section, the clamping means must also be able to perform axial movements.

To start the production of the monocrystal, a crystal known as a seed crystal is used, on which the monocrystal will be grown. Inasmuch as a crystal growth free of dislocations is required, a thin neck must be drawn out at the beginning of the pulling process, after growth has been started on the seed crystal. In this manner, dislocations in the crystal lattice are able to "grow themselves out." The thin neck, which is adjoined by the transitional zone, also called the shoulder, has, in practice, a diameter between about 2 and 4 mm; it is thus the weakest link between the clamp and the monocrystal in formation.

The diameters of the finished monocrystals are usually greater than 50 mm, and sometimes even greater than 80 mm. The length achievable today amounts to about 800 to 1000 mm. For reasons of economy, the largest possible crystals are desired, i.e., crystals of greater diameter and greater length. The attainment of this objective is considerably hampered by the apparatus known today for the following reasons.

The rotation of the crystal produces vibrations due to virtually unavoidable out-of-round growth of the crystal. This creates the danger that, if the vibrations are too great, the crystal structure will be influenced in such a manner that the required freedom from dislocations will be lost. Above all, however, the danger exists that the vibrating crystal will come in contact with the heating device or will break off at the neck, thus immediately stopping the process. The desirable increase in the length and the diameter of the crystal is therefore greatly limited by the low strength of the neck. In addition, a higher speed of rotation of the crystal is also desired, so as to improve the distribution of the doping substances in the crystal lattice. The increase of this speed, too, is limited by the thin neck, since any imbalance would result in the early breaking of the neck.

German "Offenlegungsschrift" No. 2,348,883 has disclosed an apparatus similar to the kind initially described, in which the supporting means consists of at least two jaws movable axially, i.e., parallelly to the crystal axis, which in their operation engage the conical part of the monocrystal being formed. In practice, however, this conical portion has by no means an ideal conical shape, but instead has a considerable amount of surface irregularities which are mentioned in the specification. To compensate for these irregularities, the jaws are covered with an overlay of a compressible material such as graphite felt. Such a material, however, is by no means capable of compensating all of the surface irregularities encountered in practice to such an extent that no transverse forces will be exercised on the conical portion and thus on the neck. It is therefore admitted in the specifica- that a slight transverse movement of the conical portion may be produced by the supporting means. Experience has shown that, due to the brittleness of the material being used, even a slight transverse movement often produces breaking of the neck. The prior-art apparatus has the additional disadvantage that the points of engagement of the supporting means are located virtually at the lowermost point on the monocrystal, so that the result is a supporting action that diminishes with the increasing length of the monocrystal. This is explained by the continuously deteriorating leverage exercised by the jaws on the monocrystal.

The most important disadvantage of the prior-art apparatus, however, is to be seen in the fact that the supporting means transmits a considerable axial component of force to the monocrystal, the reaction force of which is applied precisely to the thinnest cross section of the monocrystal, namely the neck. It is therefore stated quite correctly in the above-mentioned specification that the pressure exercised by the supporting means must not exceed the maximum allowable tensile stress in the smallest cross section between the seed and the conical portion. This maximum permissible tensile stress, however, is by no means a precisely defined magnitude, and furthermore it is foreseeably diminished by the bending moments exercised on the neck due to the surface irregularities in the conical portion. The danger of the breaking of the neck and hence of the interruption of the growth of the crystal is thus unacceptably increased.

On the basis of German Pat. No. 1,210,415, U.S. Pat. No. 2,876,147 and German Auslegeschrift No. 1,282,601, it is known, in the zone melting process, to guide the formed monocrystal between radially urged transport rolls, i.e., to set it in rotation and at the same time to pull it continuously in the axial direction. The rolls in this case have an entirely different purpose, namely to center the rod as accurately as possible during its continuous movement. Thus, for example, the upper, solid part of the monocrystal is to be held in correct alignment by means of the guiding rolls, which are resiliently urged against one another (German Auslegeschrift No. 1,282,601, col. 3, lines 52–58). The previously known apparatus with positive centering of the monocrystal do not serve for the zone melting of monocrystals which are joined to the seed crystal by the above-described think neck. Consequently, the problem of breakage at a point on the neck is not involved at all. The use of the previously known apparatus in the production of monocrystals in accordance with the generic concept of the present invention would very quickly result in the breaking of the neck.

On the basis of U.S. Pat. No. 3,002,821, an apparatus is known for the continuous drawing of a monocrystal from a melting crucible, in which apparatus the monocrystal is pulled by two sets of radial gripping jaws in a kind of pilgrim step movement. These jaws, too, produce a positive centering of the monocrystal, which is possible only because the monocrystal has not been reduced in cross section by a neck.

THE INVENTION

The invention is therefore addressed to the problem of improving an apparatus of the initially described kind such that monocrystals of larger diameter and greater length can be produced with it than formerly.

The solution of this problem is accomplished by the present invention by the fact that the gripping bodies are constructed or arranged such that they first perform a radial approach until they are in a virtually force-free engagement with the monocrystal, adapting themselves to the surface geometry and position of the monocrystal, and then the gripping force is increased and the gripping bodies are locked.

Pursuant to the teaching of the invention, the gripping bodies perform, in relation to the monocrystal, a composite or step-wise movement until the full gripping force is produced. Regardless of the possibly excentric or even slanting position of the monocrystal and/or other surface irregularities of the monocrystal, the gripping bodies first apply themselves to the monocrystal without arousing any appreciable reaction forces in it, and then the gripping force is increased with the gripping bodies still in a substantially unaltered position. The positive centering of the monocrystal is thus deliberately avoided, and the monocrystal is securely held in the position that is determined by the neck.

How this solution to the problem can be achieved will be described further in conjunction with a number of advantageous embodiments of the invention.

The solution proposed by the invention offers the additional advantage that the supporting device can engage the monocrystal at virtually any desired point, and thus optimum conditions can always be created with respect to the forces acting on the neck. In particular it is possible, after a portion of the length of the monocrystal has been produced, to reset the supporting device, i.e., to advance it towards the melting zone. In this manner it is possible to produce monocrystals of a length which is limited only by the height of the apparatus. Breaking off at the neck is still securely prevented in this case, since the gripping device will automatically adapt itself to the changes in the surface geometry and position of the monocrystal at the new point of engagement.

In addition, it is possible to distribute a plurality of supporting devices over the length of the monocrystal, so that the tipping over of the finished portion of the crystal is prevented and the completion of the monocrystal is made possible even if through accidents due to other causes should unexpectedly result in a fracture of the neck. In an especially desirable manner, several systems of gripping bodies are distributed over the length of the monocrystal in different horizontal planes.

Another advantage of the solution proposed by the invention lies in the fact that no additional axial forces whatever act upon the neck, so that the gripping force applied by the supporting device is not limited by the maximum acceptable tensile stress in the narrowest cross section. The stability of the mounting of the monocrystal is consequently substantially increased, so that the required freedom of dislocations in the crystal structure is not endangered by vibrations. Also the speed at which the crystal is rotated can be increased appreciably, since any imbalance that might occur will be counteracted by the supporting device. In this manner the quality of the finished crystal is improved.

With regard to the necessary ability of the supporting device to be moved, it is necessary only to fulfill the requirement that the supporting device not interfere with the movement of a heating device, if such a movable heating device is used, as it is, for example, in the case of potless zone melting using an induction coil. To this end the supporting device must be at least partially retractable to a point below the seed crystal holder. However, it can follow the movement of the induction coil as long as the monocrystal that has been formed is of a sufficiently low temperature to provide a sufficiently solid surface.

The number of gripping bodies used in each plane is basically unimportant. However, it is especially advantageous to use three gripping bodies in each plane, distributed about the circumference of the crystal.

To enable the gripping bodies to be moved in the manner described above, it is desirable to develop the invention further by associating the gripping bodies with a set of guide rods displaceable parallel to the crystal axis, such that it will be possible to displace them independently of the gripping action. Such a possibility is excluded, for example, in the case of German Offenlegungsschrift No. 2,348,883.

As especially simple and hence inexpensive and reliably operating embodiment of the invention is characterized by the fact that the gripping bodies are in the form of a solid of revolution and are loosely held in a cagelike receptacle concentrically surrounding the monocrystal and having seating surfaces for the gripping bodies which face the monocrystal at an acute angle thereto and are at such an average distance from the crystal surface that the gripping bodies apply themselves on the one side to the monocrystal and on the other side to the seating surfaces.

In this case the gripping bodies, either after they have been laid into the receptacle, or after they have been released within the receptacle, apply themselves to the monocrystal at first with virtually no force, i.e., by their own weight, doing so in accordance with the surface geometry and position of the monocrystal. At a point where the crystal surface has sunken, the gripping body will settle somewhat deeper into the receptacle; at a point where the crystal surface has bulged outwardly, the gripping body will be situated at a higher level on the inclined seating surface. Similar accommodation will take place if the monocrystal assumes an oblique attitude. It is in this manner that the above-mentioned adaptation of the supporting device to the afterward no longer varying surface shapes of the monocrystal takes place. The gripping force that is established automatically becomes extraordinarily great as soon as there is any tendency for the crystal to be deflected from its position once this position has been established. If the angle between the seating surfaces and the crystal axis is selected such that self-locking occurs, the gripping bodies are automatically locked in place. To permit the grip on the desired portion to be released, a gripping body lifting means is advantageously associated with the gripping bodies for the purpose of releasing the grip. Such a lifting means can consist, for example, in an especially simple manner, of a platform for the gripping bodies, which is associated with a bellows operated by a pressure medium. When the bellows is actuated, the gripping bodies will be raised up in the wedge-shaped gap between their seating surfaces and the crystal surface, and thus the crystal surface will be released.

The solids of rotation constituting the gripping bodies can be rollers, rings or balls such as those used in ball and roller bearings. If the gripping body receptacle is axially symmetrical in shape, i.e., if it is constructed in the manner of a swivel, it is desirable to use balls as the gripping bodies. To prevent the gripping bodies from falling out of the receptacle when there is no monocrystal in it, the platform is made so as to slope upwardly towards the crystal axis. It can be in the form of a continuous gradient whereby the gripping bodies will be given the tendency to move away from the crystal surface. On the other hand, it is also possible to provide the platform with a circumferential raised edge facing the monocrystal.

The use of solids of rotation as gripping bodies is especially desirable when two receptacles containing gripping bodies are disposed one above the other on the same set of guide rods. In this case a mutual interference by driving members is excluded.

Another variant of the invention is characterized in that the gripping bodies are disposed at the end of hydraulic or pneumatic actuators aimed radially against the crystal axis, which are fed with air or hydraulic fluid through the guide rods, separate check valves being provided in the individual air or hydralic fluid lines. The gripping bodies in this case can be in the form of points, rounded buttons or flat plates made of heat-resistant material or covered therewith.

It is desirable to use small bellows as the hydraulic or pneumatic actuators, these being attached to the guide rods at their extremities opposite the gripping bodies, and being supplied with the air or hydraulic fluid through the said guide rods. It is desirable for a common pump to serve as the source of pressure medium for all of the actuators, so as to assure the uniformity of the forces acting on the gripping bodies. When the gripping action is initiated, the gripping bodies will in this case apply themselves to the monocrystal with virtually no force, adaptation to the surface taking place automatically. The gripping body that is the first to reach the crystal surface will come to a stop, while additional pressure medium flows into the other actuators until the gripping bodies in them also make contact. A slight but harmless force difference will be produced by the spring characteristic of the bellows, although they can nevertheless be kept sufficiently flat. After the gripping bodies make contact with the crystal, the gripping force can be increased by increasing the pressure of the hydraulic fluid or air. No locking takes place in this manner, however, since it is possible for the pressure medium to be equalized through the common supply line. To prevent the pressure medium from escaping from the actuators, separate check valves are disposed in the individual pressure medium lines, which are closed after the desired pressure has been produced in the medium. It is in this manner that the required locking of the supporting device is achieved.

Lastly, another variant of the invention is characterized by the fact that the gripping bodies are disposed at the end of parallelogrammatic linkages connected to the set of guide rods, the places of action of these linkages being aligned radially to the crystal axis, the guide rods and the parts of the linkage having in the retracted state substantially the form of an L, while in the gripping state they are extended substantially straight. Such an articulation has the additional advantage that it can be retracted very far away from the monocrystal to permit, for example, the movement of the induction coil in the zone melting process. Also, such an articulation can be very easily adjusted to greatly differing crystal diameters. The operation of the linkage is performed in a manner to be described in the specific description.

Examples of the embodiment of the invention along with details and the manner of operation thereof will now be described with references to FIGS. 1 to 5.

Figure 1:
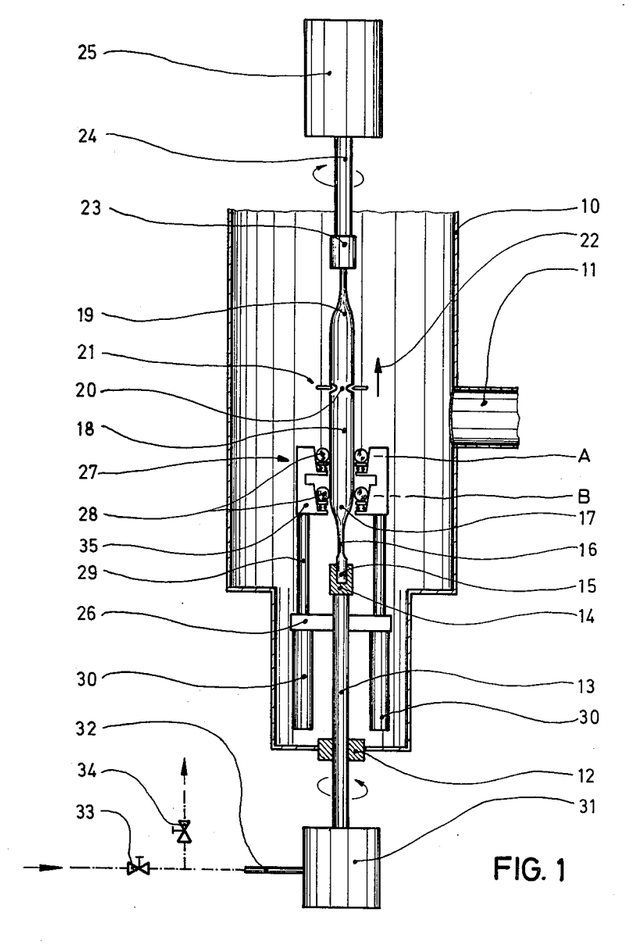
FIG. 1 is a vertical cross-sectional view through a complete apparatus using spherical bodies as the gripping means

In FIG. 1, which shows an apparatus for the potless zone melting process, 10 designates a chamber in which a vacuum sufficient for the zone melting process can be produced by means of a pumping system which is not shown. The chamber 10 has at its bottom a vacuum-tight rotary shaft seal for a driving shaft 13 having at its upper end a mounting 14 for a seed crystal 15. The seed crystal 15 is connected by a constriction or neck 16 and a conical transitional zone 17 to the monocrystal proper 18. The latter has been produced by melting the starting material in rod shape, whose non-molten portion is still visible and is identified as 19. Between the monocrystal 18 and the untreated portion 19 there is a melting zone 20 which has been formed by the influence of a vertically movable induction coil 21. The induction coil moves continuously upward in the direction of the arrow 22, the monocrystal being produced in this manner. The zone melting process is represented at a stage in which approximately two-thirds of the melting process has been completed. The neck 16 and the conical zone 17 have been produced by controlling the parameters of the process accordingly. However, details in this regard belong to the state of the art, and therefore there is no need to describe them herein. The upper end of the rod-like starting material is fastened in an additional mounting 23 which is connected by a shaft 24 to a motor 25.

To the shaft 13 there is fastened on a crosspiece 26 a supporting means 27 rotating together with the shaft, the essential part thereof consisting of a plurality of gripping bodies 28 distributed circumferentially on its substantially cylindrical surface and adapted for application radially to the monocrystal. In the present case, two systems of gripping bodies 28 are disposed in different horizontal planes A and B. It is in this manner that the monocrystal 18 is prevented from tipping over even if the bottleneck 16 should break.

The gripping bodies 28 are associated with a set of guiding rods 29 displaceable parallel to the crystal axis, their displacement being independent of any gripping action and being brought about by means of driving cylinders 30 with which the set of guiding rods 29 cooperates through pistons which are not shown. The operation of the driving cylinders 30 is performed through appropriate passages in the shaft 13 and in the crosspiece 26; these passages are not shown in the drawing. The feeding of the pressure medium to the shaft 13 is accomplished through a conventional rotatory coupling 31 and a line 32 communicating through a valve 33 with a source of pressure medium, which is not shown. Another valve 34 serves to relieve pressure when the gripping action is to be exercised.

Figure 2:
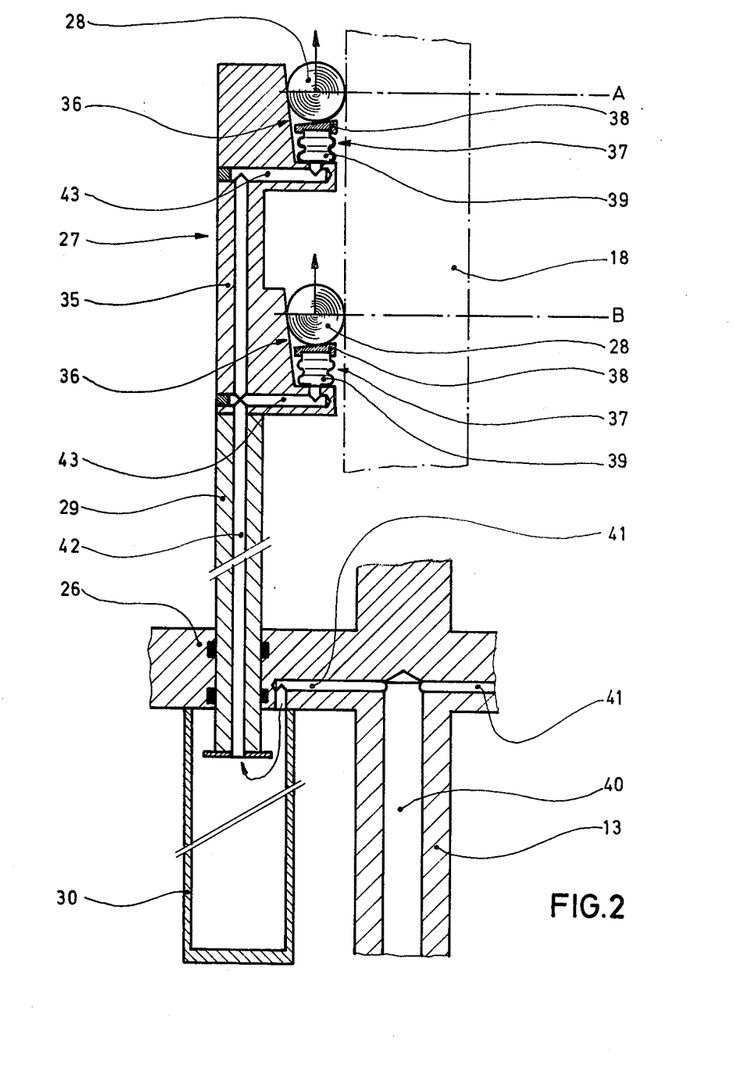
FIG. 2 is a greatly enlarged fragmentary cross-sectional view of the apparatus of FIG. 1.

The gripping bodies 28 in the present case are in the form of solids of rotation (balls), and they are held loosely in a receptacle 35 concentrically surrounding the monocrystal in the manner of a bearing cage. The receptacle 35 is of circular shape and is provided with an internal configuration whereby seats are formed for the gripping bodies, the said seats being disposed at an acute angle to the axis of the monocrystal 18 (FIG. 2). The seats 36 are at such an average distance from the surface of the monocrystal 18 that the gripping bodies on the one side engage the monocrystal and at the other side engage the seats, as best seen in FIG. 2. The angle selected for the hollow cone formed between the seats 36 and the crystal axis is chosen such that self-locking will occur. The receptacle 35 is joined to the upper end of the guiding rods 29 in such a manner that the pressure medium will be unable to escape.

In FIG. 2, in which identical parts are provided with the same reference numbers as in FIG. 1, it can furthermore be seen that underneath the gripping bodies 28 there is provided a lifting device 37 by which the grip is released when the gripping bodies 28 are lifted in the direction of the arrows. The lifting device 37 consists of a platform 38 which can be in the form of a circular ring, for example. With the platform 38 there is associated at least one bellows 39 which can be actuated by a pressure medium. The pressure medium is fed to the lifting device 37 through a bore 40 in the shaft 13, through transverse bores 41 in the crosspiece 26, through the driving cylinder 30 and bores 42 in the guiding rods 29 of the supporting means 27. The bores 42 continue within the receptacle 35 and communicate with the bellows 39 through the radial bores 43. The platform 38 slopes upwardly in the direction of the axis of the monocrystal 18, so that the gripping bodies 28 have the tendency, when the grip is released, to roll away from the monocrystal 18 towards the seat 36. If platform 38 is in the form of a ring, its top surface will be in the shape of an obtuse cone.

Figure 3:
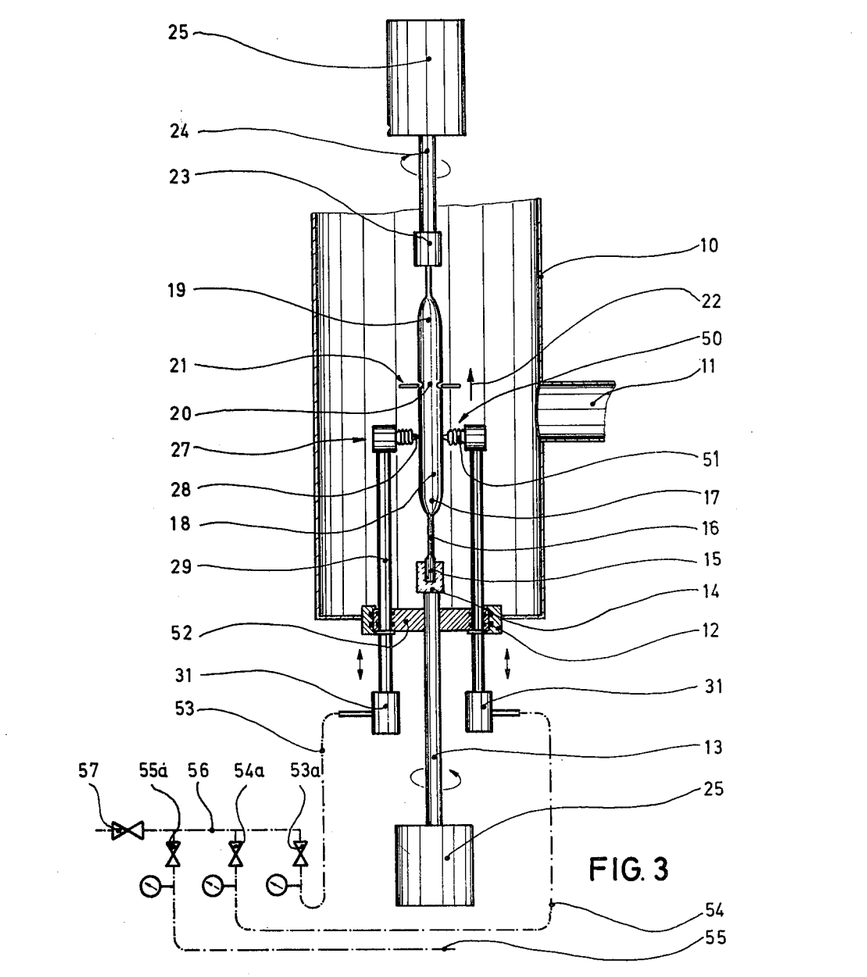
FIG. 3 is a vertical cross-sectional view through a complete apparatus having gripping means disposed at the ends of hydraulic driving means, the hydraulic fluid system of the apparatus being represented diagrammatically.

In FIG. 3, parts identical or equivalent to those of FIG. 1 are given the same reference numbers. The essential difference in this case, however, is that the supporting means 27 in this case contains gripping bodies 28 which are disposed at the end of hydraulic or pneumatic actuator means 50. The actuator means consist of bellows 51 which are mounted on the upper end of the set of guiding rods 29. The guiding rod set is again of hollow construction and serves to carry the pressure medium. The set of guiding rods 29 is mounted for longitudinal displacement in a disk 52, with the interposition of seals 52a. The disk 52 is fastened vacuum-tight to the shaft 13, so that the guiding rod set 29 with the gripping bodies 28 can rotate together with the crystal mounting 14 and the seed crystal 14. The disk 52 cooperates with the part of the shaft seal 12 that is on the housing side, again with the interposition of packings 12a. The operation of the actuator means 50 is performed through the rotatory couplings 31, which are represented only symbolically, since a coaxial rotatory coupling is, of course, required on account of the necessary rotation of the guiding rod set 29. Each of the actuators 50 is connected by a separate pressure medium line 53, 54 and 55 to a pressure medium source which is not shown. In these pressure medium lines are provided separate check valves 53a, 54a and 55a. The apparatus of FIG. 3 is provided with three gripping bodies 28 and three actuators 50, of which only two visible in the drawing. The pressure medium line 55 leads to the third actuator, which is not shown. A common pressure medium supply line 56 can contain a main shut-off valve 57.

Figure 4:
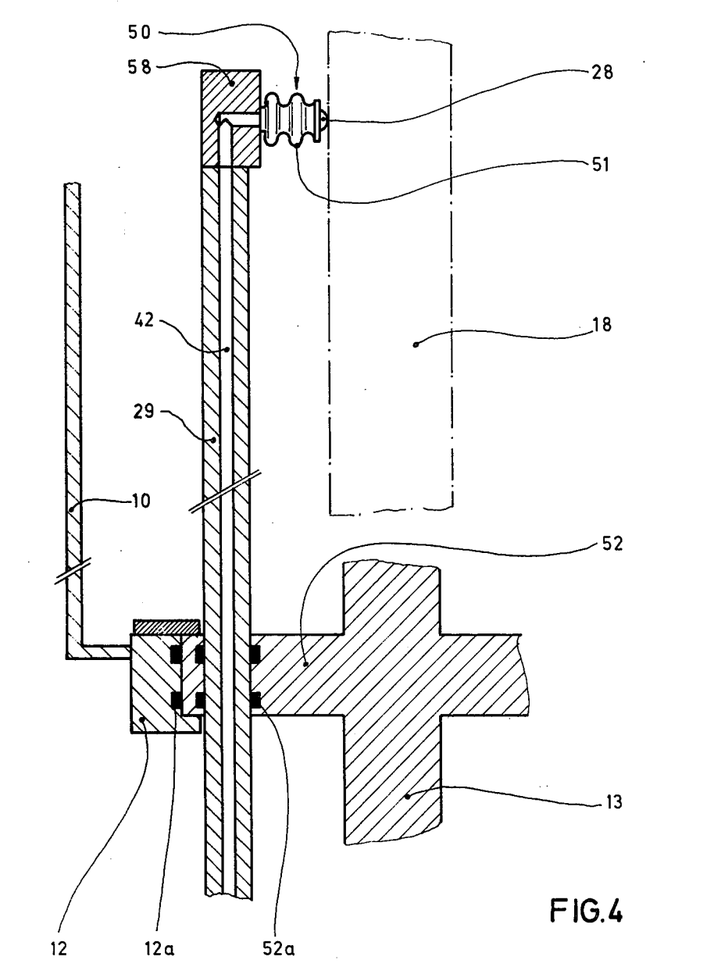
FIG. 4 is a fragmentary cross-sectional view of the apparatus of FIG. 3.

In FIG. 4 the following details are more clearly represented. The guiding rod 29 is provided with a bore 42 and has at its upper end a coupling 58 on which the bellows 51 is disposed radially to the crystal axis. To the end of the bellows 51 there is fastened the gripping body 28 which is in the form of a disk with a cap-like convexity in its center.

The apparatus of FIGS. 3 and 4 operates in the following manner: After production of the "bottleneck" 16 and the conical zone 17, plus a small part of the length of the monocrystal 18, the heating system in the form of the induction coil 21 has assumed a position at a corresponding level. The gripping bodies 28 are then raised by means of the guiding rod set 29 to the position represented in FIG. 3. The bellows 51 are then still in a retracted position, in which the gripping bodies 28 do not engage the monocrystal 18. Then, with the valves 53a, 54a and 55a as well as 57 open, a pressure medium is delivered to the actuators 50, so that the bellows 51 expand in the radial direction until the gripping bodies 28 come into engagement with the monocrystal 18. The first gripping body 28 to come into engagement with the monocrystal 18 will remain in this position while the rest of the gripping bodies 28 continue their movement until they engage the monocrystal 18. Thus an adaptation of the gripping bodies 28 to the monocrystal takes place automatically without producing unacceptable transverse pressures against it. Then the pressure in the actuator is increased slightly and the shut-off valve 57 is closed. The monocrystal 18 might in this case still be able to be moved in a radial direction, whereupon the pressure medium displaced from one actuator 50 would flow around through the pressure medium lines 53, 54 and 55 to the other actuators 50. To eliminate this possibility and lock the actuators 50, check valves 53a, 54a and 55a are provided in the pressure medium lines. As soon as they close, the supporting means 27 is locked and the monocrystal 18 is securely held.

Figure 5:
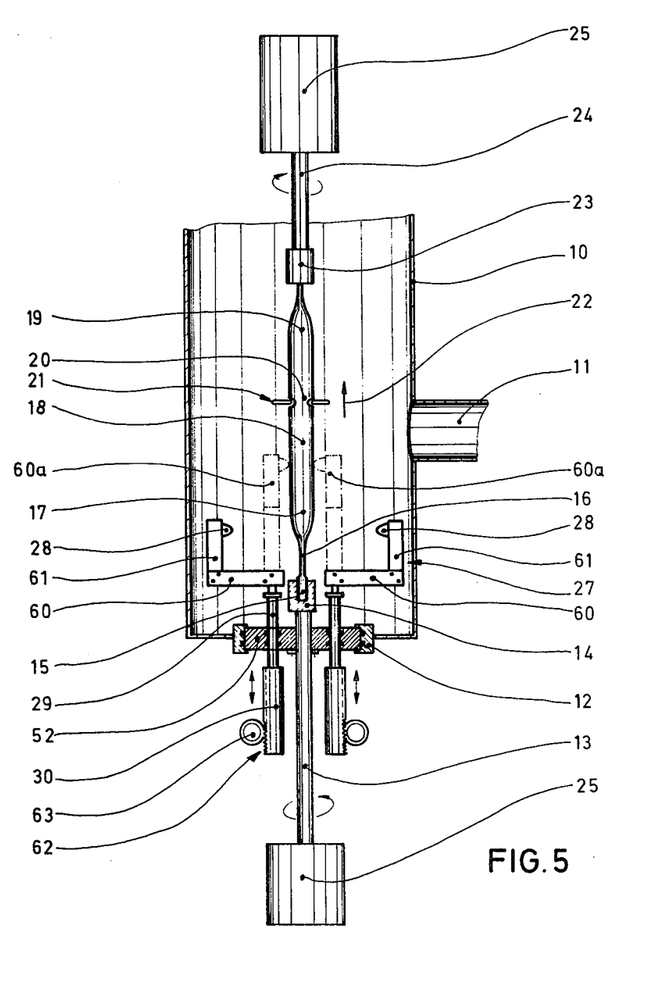
FIG. 5 is a vertical cross-sectional view taken through a complete apparatus having gripping means mounted on the end of parallelogrammatic linkages.

In the embodiment shown in FIG. 5, the gripping bodies 28 are disposed on the end of parallelogrammatic linkages 60 associated with the guiding rod set 29, the plane of articulation thereof being disposed radially to the axis of the monocrystal 18. The motion of the parallelogrammatic linkages extends from the retracted position shown in solid lines to the extended position 60a represented by the broken lines. Between the gripping bodies 28 and the parallelogrammatic linkage 60 there is also a holder 61, which preserves its vertical position during the movement of the parallelogrammatic linkage. It can be seen in FIG. 5 that the guiding rod set 29 and the linkage parts 60 and 61, when in the retracted position (solid lines), assume a substantially L-shaped configuration, while in the gripping state they assume a substantially linear position, wherein the gripping bodies 28 firmly engage the monocrystal. The movement of the linkage systems 60 is accomplished by means of actuating cylinders 30 in a manner which is not represented and with which the average technically trained person is familiar. The guiding rod set 29 is, in this case as well, mounted for longitudinal displacement in the disk 52. The longitudinal displacement is produced by means of a rack 62 disposed on the actuating cylinder 30 and the pinion 63 meshing therewith.

The operation of the hydraulic or pneumatic systems and the locking action are brought about in much the same manner as in FIG. 3. It is apparent here again that, when the gripping bodies 28 are locked in place, a reliable and secure holding of the monocrystal is accomplished.

What is claimed is:

1. Apparatus for producing monocrystals by crucible free zone melting, wherein the molten zone moves upwardly along a rod from which the monocrystal is produced and wherein the monocrystal includes a seed crystal, a neck portion continuing therefrom, a conical transitional zone and a substantially cylindrical main part, said apparatus inlcuding a chamber for the formation of a protective atmosphere, heating means for the production of melting heat for the molten zone, driving means for the mechanical movements necessary for the crystal formation, mounting means for the seed crystal, and supporting means which is applicable to the monocrystal beyond the conical portion and below the molten zone for supporting the monocrystal in the given orientation thereof comprising a plurality of rotationally symmetrical gripping means distributed about the circumference of the monocrystal and outer inwardly and downwardly sloping walls with which the gripping means are in contact, and means for raising and for lowering said gripping means having an upper surface for supporting the gripping means whereby on lowering, the gripping means are first caused by the sloping walls to perform a radial approach to the monocrystal until contact is made therewith to adapt the gripping means to the substantially cylindrical surface geometry and to the position of the monocrystal, and on further lowering thereafter increasing the gripping force all without moving the monocrystal out of its given orientation and maintaining the gripping means in a gripping position.

2. Apparatus of claim 1 wherein the gripping means are constructed as solids of rotation and are mounted loosely in cage-like receptacle means concentrically surrounding the monocrystal, the seating surfaces provided for the clamping means and facing the monocrystal being aligned at an acute angle to the crystal axis and being at such an average distance from the crystal surface that the gripping means apply themselves on the one side of the monocrystal and on the other side to the seating surfaces.

3. Apparatus of claim 2 wherein the angle between the seating surfaces and the crystal axis is chosen such that self-locking will occur.

4. Apparatus of claim 2 wherein with the gripping means there is associated gripping body lifting means by which the locking can be released.

5. Apparatus of claim 4 wherein the lifting means includes platform means for the gripping means, with which platform means there is associated at least one bellows means which can be actuated by a pressure medium.

6. Apparatus of claim 5 wherein the pressure-medium operation of the lifting means is performed through a hollow shaft for driving the seed crystal and /through/ the supporting means.

7. Apparatus of claim 5 wherein the platform means slopes upwardly in the direction of the crystal axis.

8. Apparatus of claim 2 wherein a plurality of receptacle means with gripping means are provided one over the other on the same set of guide means.

* * * * *